(12) United States Patent
Conrads et al.

(10) Patent No.: US 10,518,555 B2
(45) Date of Patent: Dec. 31, 2019

(54) LASER PRINTING SYSTEM

(71) Applicant: PHILIPS PHOTONICS GMBH, Ulm (DE)

(72) Inventors: Ralf Gordon Conrads, Kempen (DE); Stephan Gronenborn, Aachen (DE); Gero Heusler, Aachen (DE); Holger Moench, Vaals (NL)

(73) Assignee: PHILIPS PHOTONICS GMBH, Ulm (DE)

( * ) Notice: Subject to any disclaimer, the term of this patent is extended or adjusted under 35 U.S.C. 154(b) by 600 days.

(21) Appl. No.: 15/103,888

(22) PCT Filed: Dec. 16, 2014

(86) PCT No.: PCT/EP2014/077931
§ 371 (c)(1),
(2) Date: Jun. 13, 2016

(87) PCT Pub. No.: WO2015/091459
PCT Pub. Date: Jun. 25, 2015

(65) Prior Publication Data
US 2016/0311230 A1 Oct. 27, 2016

(30) Foreign Application Priority Data
Dec. 17, 2013 (EP) .................................. 13197751

(51) Int. Cl.
*B41J 2/455* (2006.01)
*B41J 2/45* (2006.01)
(Continued)

(52) U.S. Cl.
CPC ............ *B41J 2/455* (2013.01); *B22F 3/1055* (2013.01); *B23K 26/064* (2015.10);
(Continued)

(58) Field of Classification Search
CPC ...... B41J 2/455; B41J 2/451; G03G 15/04054; G03G 15/225; B29C 64/277; B29C 64/20; B29C 64/153; B29C 64/386; B23K 26/064
See application file for complete search history.

(56) References Cited

U.S. PATENT DOCUMENTS

| 5,793,783 A | 8/1998 | Endriz |
| 5,940,113 A | 8/1999 | Wilson |

(Continued)

FOREIGN PATENT DOCUMENTS

| EP | 0781661 A1 | 2/1997 |
| EP | 1241013 A1 | 9/2002 |

(Continued)

*Primary Examiner* — Kristal Feggins
(74) *Attorney, Agent, or Firm* — Leydig, Voit & Mayer, Ltd.

(57) ABSTRACT

The invention describes a laser printing system (100) for illuminating an object moving relative to a laser module of the laser printing system (100) in a working plane (180) and a corresponding method of laser printing. The laser module comprises at least two laser arrays (110) of semiconductor lasers (115) and at least one optical element (170). The optical element (170) is adapted to image laser light emitted by the laser arrays (110), such that laser light of semiconductor lasers (115) of one laser array (110) is imaged to one pixel in a working plane (180) of the laser printing system (100) and an area element of the pixel is illuminated by means of at least two semiconductor lasers (115). The optical element does not project or focus laser light of each single semiconductor laser (115) to the working plane (180) but images the whole laser arrays to the working plane. The overlap of the laser light emitted by the semiconductor lasers (115) may improve the homogeneity of illumination or energy input and the reliability regarding malfunctions of single semiconductor lasers (115).

14 Claims, 10 Drawing Sheets

(51) Int. Cl.

| | | |
|---|---|---|
| *B33Y 40/00* | (2015.01) | |
| *B33Y 10/00* | (2015.01) | |
| *B33Y 30/00* | (2015.01) | |
| *B33Y 50/02* | (2015.01) | |
| *B23K 26/064* | (2014.01) | |
| *B23K 26/342* | (2014.01) | |
| *B22F 3/105* | (2006.01) | |
| *B23K 26/08* | (2014.01) | |
| *H01S 5/00* | (2006.01) | |
| *H01S 5/42* | (2006.01) | |
| *B29C 64/153* | (2017.01) | |
| *B29C 64/20* | (2017.01) | |
| *B29C 64/386* | (2017.01) | |
| *B29C 64/277* | (2017.01) | |
| *G03G 15/22* | (2006.01) | |

(52) U.S. Cl.
CPC ........ *B23K 26/0853* (2013.01); *B23K 26/342* (2015.10); *B29C 64/153* (2017.08); *B29C 64/20* (2017.08); *B29C 64/277* (2017.08); *B29C 64/386* (2017.08); *B33Y 10/00* (2014.12); *B33Y 30/00* (2014.12); *B33Y 40/00* (2014.12); *B33Y 50/02* (2014.12); *B41J 2/451* (2013.01); *H01S 5/0071* (2013.01); *H01S 5/423* (2013.01); *B22F 2003/1057* (2013.01); *G03G 15/225* (2013.01)

(56) References Cited

U.S. PATENT DOCUMENTS

| | | | |
|---|---|---|---|
| 6,264,981 | B1 | 7/2001 | Zhang |
| 6,353,502 | B1 | 3/2002 | Marchant |
| 7,077,972 | B2 | 7/2006 | Ishikawa |
| 2002/0129723 | A1 | 9/2002 | Beier |
| 2002/0140918 | A1 | 10/2002 | Nakamura |
| 2003/0214571 | A1* | 11/2003 | Ishikawa ............ B23K 26/0604 347/255 |
| 2005/0151828 | A1 | 7/2005 | Maeda |
| 2007/0273957 | A1 | 11/2007 | Zalevsky |
| 2009/0225150 | A1 | 9/2009 | Ebisawa |
| 2012/0188327 | A1 | 7/2012 | Minabe |
| 2012/0281293 | A1 | 11/2012 | Gronenborn |
| 2016/0279707 | A1* | 9/2016 | Mattes ................ B41J 2/451 |

FOREIGN PATENT DOCUMENTS

| | | |
|---|---|---|
| JP | 2002019177 A | 1/2002 |
| JP | 2009056796 A | 3/2009 |
| WO | WO2011021140 A2 | 2/2011 |

\* cited by examiner

LASER PRINTING SYSTEM

FIELD OF THE INVENTION

The invention relates to a laser printing system and a method of laser printing. Laser printing refers to printing of documents as well as 3D printing by means of lasers for additive manufacturing, for example, used for rapid prototyping.

BACKGROUND OF THE INVENTION

Conventional laser printers and selective-laser melting machines consist of a single high-power laser and a scanner to scan the laser over the area to be illuminated. To increase the processing speed, it is desirable to have a printing head with several independent channels i.e. an addressable array of lasers covering a significant part of the area. Preferably, the printing head covers the full width of the area to be printed with one addressable laser source per pixel, so that the print head needs to be moved only in one direction. Reliability and service costs of such addressable arrays may be an issue.

US 2005/0151828 A1 discloses a device for xerographic laser printing. The xerographic printing system has a laser printbar imager assembly including a plurality of micro-optic light emitting arrays. The micro-optic light emitting array includes a plurality of vertical cavity surface emitting lasers, where each vertical cavity surface emitting laser is focused with a micro-optic element.

SUMMARY OF THE INVENTION

It's thus an object of the present invention to provide an improved laser printing system and a corresponding method of laser printing.

According to a first aspect a laser printing system for illuminating an object moving relative to a laser module of the laser printing system in a working plane is provided. The laser module comprises at least two laser arrays of semiconductor lasers and at least one optical element. The optical element is adapted to image laser light emitted by the laser arrays, such that laser light of semiconductor lasers of one laser array is imaged to one pixel in a working plane of the laser printing system and an area element of the pixel is illuminated by means of at least two semiconductor lasers.

Known laser printing systems either uses single high power lasers or arrays of lasers. In case of high power lasers, for example, a single edge emitting semiconductor laser may be used whereas in case of laser arrays Vertical Cavity Surface Emitting Lasers (VCSELs) are preferably used. VCSEL arrays can be easily manufactured in wafer based processes but usually emit less power as edge emitting semiconductor lasers. The optical systems of these known laser printing systems project or focus the light emitting layer of each semiconductor laser to the working plane.

In contrast to this approach the present invention proposes to image at least two laser arrays to two pixels in the working plane by means of an optical element. The image of the laser arrays does not comprise sharp images of the light emitting layers of the semiconductor lasers. Light emitted by means of at least two lasers of one of the laser arrays illuminate each area element of the pixel such that there is no area element which is only illuminated by means of one single semiconductor laser. Preferably, three, four or a multitude of semiconductor lasers of one laser array illuminate one area element of a pixel at the same time. It may even be that two laser arrays are imaged to the same pixel at the same time. More intensity can thus be provided to the working plane by using a multitude of semiconductor lasers per area element of a pixel. A diffuse image of a multitude of semiconductor lasers of the arrays form the pixels in the working plane. The laser printing system may be more reliable due to the relative low contribution of each single semiconductor laser to the illumination or energy input to an object in the working plane by means of optical energy. A malfunction of a single semiconductor laser of a laser array does consequently not cause a malfunction of the laser printing system. The wavelength of the emitted laser light is adapted to the absorption of the object in the working plane.

The laser module may move relative to the laser printing system (scanning) and/or the object may move relative to the laser printing system. The object may be a sheet of paper, a powder layer which can be sintered by means of laser printing system or any other object which can be processed by means of the laser printing system. It may be preferred that only the object is moved. The laser printing system may be enabled to illuminate the full width of the object moving perpendicular to the width of the object by means of one, two, three, four or more laser modules. The semiconductor lasers may be edge emitting semiconductor lasers but VCSEL arrays may be preferred due to lower costs.

The optical element is arranged in a way that an object plane of the optical element with respect to the working plane does not coincide with a plane of the semiconductor lasers such that the cones of laser light emitted by adjacent semiconductor lasers overlap in the object plane. The plane of the semiconductor lasers of the laser arrays is defined by means of the light emitting layers of the semiconductor lasers. The light emitting layers comprise the optical cavity of the semiconductor lasers comprising the active layer and the corresponding resonator mirrors. The optical element may be a single imaging lens or a more complex imaging optic defining an object plane relative to the working plane. The arrangement of the object plane with respect to the light emitting layers of the semiconductor lasers of the laser arrays may cause a diffuse overlapping image of the light emitting layers in the working plane. The energy distribution in the working plane may thus be more homogeneous in comparison to a projection of each light emitting layer of the semiconductor layers to the working plane. Furthermore, the optical element may be as simple as one projection lens per laser module but more complex combinations of lenses may be used in order to increase the distance between the working plane and the laser modules. No micro-lens arrays may be needed in order to provide a sharp projection of each light emitting layer.

The laser module or laser modules of the laser printing system preferably comprises three, four or a multitude of laser arrays. A single laser array may be imaged to one pixel in the working plane. The pixel may be adjacent to each other such that a part of the emitted optical power of one laser array overlaps with the optical power emitted by another laser array. It may even be that two three or more laser arrays may be mapped to the same pixel in the working plane. The optical element may comprise an array of micro-optical elements which may image, for example, laser light of two, for example, adjacent arrays of the laser module to one pixel in the working plane. Two or more arrays may in this case be imaged to one pixel. Alternatively or in addition it may be that laser light emitted by different laser arrays may illuminate the same part of a surface of an object at different times. The latter means that light of a first array may illuminate a defined surface of the object at a time $t_1$ and light of a second array may illuminate the defined surface of the object at a time $t_2$ later $t_1$ wherein the object was moved relative to the laser module(s). Furthermore, the printing system may comprise laser modules with different working planes. The latter may be done by placing laser modules at different heights relative to a reference surface and/or by providing different optical elements. Different working planes may be advantageous for three dimensional printing. Alternatively or in addition it may be that the laser module (s) can be moved with respect to the reference surface being parallel to the working planes being always at a defined distance with respect to the laser modules.

The laser arrays of the laser module or laser modules may be arranged in columns perpendicular to a direction of movement of the object in the working plane. The columns may be staggered or cascaded with respect to each other such that a first laser array of a first column of laser arrays is adapted to illuminate a first area of the object and a second laser array of a second column of laser arrays is adapted to illuminate a second area of the object, wherein the first area is adjacent to the second area such that continuous illumination of the object is enabled. The images of the laser arrays may partly overlap as discussed above.

The laser arrays may be rectangular with the long side of the rectangle being arranged parallel to a direction of movement of the object in the working plane. This arrangement allows higher total powers per pixel by providing more semiconductor lasers per pixel, without reducing the resolution in the lateral direction perpendicular to the direction of movement of the object.

The laser printing system may comprise two, three, four or a multitude of laser modules. Using a multitude of laser modules may enable a larger printing area. Furthermore, complex optical elements may be avoided by using, for example, one imaging lens per laser module.

The laser modules may be arranged in columns perpendicular to a direction of movement of the object in the working plane. The columns may be staggered or cascaded with respect to each other such that a first laser module of a first column of laser modules is adapted to illuminate a first area of the object and a second laser module of a second column of laser modules is adapted to illuminate a second area of the object, wherein the first area is adjacent to the second area such that continuous illumination of the object is enabled.

The number of columns of laser modules may be arranged in a way that the distance between laser modules in one column of laser modules is minimized. The module diameter and the width of the image of the arrays may determine the number of columns needed in order to enable an area covering illumination of the object by means of the laser modules. The bigger the diameter of the module in relation to the width of the image of the array arrangement the more columns may be needed.

The laser arrays of each laser module may be arranged in an elongated arrangement with the long side of the elongated arrangement being arranged perpendicular to the direction of movement of the object in the working plane. Each laser module may comprise, for example two, three or more columns of laser arrays perpendicular to the direction of movement of the object in the working plane. The number of arrays per column may surpass the number of columns. This arrangement may enable a homogeneous illumination of the object by means of a relatively simple driving scheme of the single arrays especially if more than one laser module is comprised by the laser printing system. Each area element of the object may in this case only be illuminated by one dedicated laser array wherein adjacent laser arrays illuminate adjacent pixels. The velocity of movement of the object in the working plane may be adapted in order to define the total energy per area element of the object.

The laser printing system may comprise two, three, four or a multitude of laser modules wherein the laser arrays of each laser module are arranged in an elongated arrangement in order to enable a broad workspace (printing width perpendicular to the direction of movement of the object) of the laser printing system.

The laser arrays of each laser module may alternatively be arranged in an elongated arrangement with the long side of the elongated arrangement being arranged slanted or rotated with respect to the direction being perpendicular to the direction of movement of the object in the working plane. A defined slanting angle or rotation of the elongated arrangement of laser modules around their centers may enable integrated intensity profiles with smooth slopes, which may also overlap with the adjacent pixels, to improve the homogeneity of the total intensity distribution, especially if the pixels are slightly misaligned with respect to each other. The latter reduces the alignment effort of the laser arrays and thus the manufacturing costs of the laser modules and the laser printing system. The misalignment may in extreme cases be compensated by an additional calibration run of the laser printing system in which the velocity of movement of the object in relation to the energy input per time and area element of a calibration object is determined.

Alternatively, two, three or more laser arrays of the same laser module or different laser modules may be arranged to illuminate the same area element of the object. The laser arrays may be arranged to subsequently illuminate the area element. The energy input per time to an area element of the object in the working plane may be increased. This may enable higher velocities of the object and thus higher throughput of the laser printing system. Furthermore, the tolerance regarding misalignment of laser arrays and malfunctions of single semiconductor lasers may be improved. The driving schemes of different arrays may be adapted based on calibration runs with calibration objects as described above.

The optical element of the laser modules may be arranged to demagnify the image of the laser arrays in the working plane. The demagnification may enable a smaller pixel size and higher energy densities. Each laser array may further comprises a micro-lens array being part of the optical element, the micro-lens array may be arranged to lower the divergence of the laser light emitted by the semiconductor lasers. The reduction of the divergence may be used to find compromise between the overlap of the laser light emitted by the semiconductor lasers in the object plane and the size of the single pixel. Furthermore, the distance between the laser array and the working plane may be adapted by means of the micro-lens array and/or the optical element (imaging optic) may be simplified.

The density of laser arrays may change in dependence of an area of the object to be illuminated by means of the laser printing system. The latter may enable higher power densities at defined parts of the object. Alternatively or in addition the density of the semiconductor lasers within the arrays may be adapted such that, for example, less or more intensity may be provided at the rim of the pixels. Furthermore, the shape of the arrays may be tailored in order to improve the homogeneity and/or to create a defined intensity distribution in the working plane. The arrays may, for example, have a diamond, triangle, round, elliptical, trapezoid or parallelogram shape.

The laser printing system may comprise at least a first and a second laser module arranged next to each other. Each laser module comprises at least two laser arrays, wherein at least one of the two laser arrays of the first or the second laser module is arranged as an overlap laser light source such that in operation the same area element in the working plane can be illuminated by the overlap laser light source and a laser array of the laser module arranged next to the laser module comprising the overlap laser light source.

The overlap laser light source is arranged to compensate potential misalignments of the laser modules which may result in unintended illumination gaps on the object in the working plane. Therefore the overlap may be partially.

The laser arrays illuminate each one pixel in the working plane. The laser array which is arranged as overlap laser light source may be arranged to illuminate the same pixel or a part of the same pixel as the laser array of the neighboring laser module. This means that both laser arrays can illuminate the same area element in the working plane at the same moment in time. Alternatively, the overlap laser light source may be arranged to illuminate the same area element as the laser array of the neighboring laser module but later or earlier in time. The light of the overlap laser light source may, for example, illuminate one area element of an object in the working plane at a time t1 and the laser array of the neighboring laser module may illuminate the same area element at a time t2 later than t1 because of the movement of the object relative to the laser modules. The relative movement may be caused by a movement of the object, a movement of the laser modules or movement of the object and the laser modules. The total intensity which is provided to a defined area element of the moving object or moving laser modules has to be adapted such that essentially the same energy is provided per area element as in the case of perfectly aligned laser modules which wouldn't need an overlap laser light source. The energy which is provided per area element has to be adapted such that defects in the object are avoided. Only the overlap laser light source or the laser array of the neighboring laser module may be used if there is a perfect match between the illuminated areas. Alternatively, both may be used with adapted intensity (e.g. 50% intensity) wherein the adapted intensity may be adapted to the relative velocity of the object with respect to the laser module. The adaption of the provided laser light may be important if there is no perfect match between the illuminated area elements (e.g. only half overlap due to misalignment) in order to avoid that too much or too little energy is provided.

A total intensity which is provided to at least one defined area element in the working plane may be such that essentially the same energy is provided per the at least one defined area element as in the case of aligned laser modules without an overlap laser light source.

In addition, a total intensity which is provided to at least one defined area element in the working plane may be such that essentially the same energy is provided per the at least one defined area element as in the case without a time offset t2−t1 between the illumination of the at least one defined area element by the laser array and the corresponding overlap laser light source.

The adapted intensity of a laser array and/or a corresponding overlap laser light source may be such that an energy loss of a defined area element in the working plane that is illuminated by the laser array at a time t1 and by the overlap laser g source at a time t2 is compensated.

The adapted intensity of a laser array and/or a corresponding overlap laser light source may be selected depending on a building material used for 3D printing.

In a laser system comprising an overlap laser light source, laser light sources as single lasers may be used instead of laser arrays as described above.

One pixel may be illuminated by a multitude of semiconductor lasers of a laser array at the same time and the total number of semiconductor lasers may be such that failure of less than a predetermined number of the semiconductor lasers reduces the output power of the laser array only within a predetermined tolerance value. This avoids that the requirements with respect to the working life of the semiconductor lasers is unnecessarily increased.

A laser module may be configured to illuminate at least 2, more preferably 4, 16, 32, 64 or more pixels using a single optical element associated with the laser module.

The optical element associated with a laser module may have an outer contour obtained from a circular or rotationally symmetrical contour which is truncated on two opposing sides and wherein the opposing sides are aligned with respect to each other along an axis which is preferably oriented in a direction perpendicular to the direction of movement. By means of this a compact design of an illumination unit comprising a plurality of modules which are staggered in the direction of movement can be achieved.

A control device may be provided which controls the semiconductor lasers individually or the laser array in such a manner that a semiconductor laser or a laser array which is not used for illuminating is used for providing heat to the working plane.

The semiconductor laser or a laser array which is not used for illuminating may be operated with a lower power than a semiconductor laser or a laser array which is used for illuminating.

At least two semiconductor lasers of one laser array or at least two sub-groups of semiconductor lasers of one laser array may be individually addressable such that an output power of the laser array is controllable by switching off one or more semiconductor lasers or one or more sub-groups of semiconductor lasers. This allows to perform various functions with the respective laser array, such as to use a laser array for heating without melting or sintering of the building material or to provide a required intensity in the case of overlap laser light sources.

A plurality of semiconductor lasers forming an array may be arranged such that an outer contour of the array has a substantially polygonal, preferably a substantially hexagonal shape. With such a design the intensity distribution of the array is substantially free from sharp edges.

According to a still further aspect, a laser printing system is provided, wherein the one ore more laser modules comprise preferably a protective device.

The protective device may be formed of a plate that is transparent for the laser light, preferably a glass plate. The protective device protects the optical elements and light sources and keeps the laser modules free from vapors and condensates.

A temperature control device may be provided that controls e temperature of the protective device.

The temperature control device may be configured to heat the protective device such that thermal radiation from material in the working plane to the protective device is substantially prevented.

The laser modules form an illumination unit and the illumination unit may be configured to move across the working plane.

One laser array may include at least two seminconductor lasers.

The semiconductor lasers may be VCSEL (Vertical Cavity Surface Emmitting Laser) and/or VECSEL (Vertical External Cavity Surface Emitting Laser).

According to a further aspect of the present invention a method of laser printing is provided. The method comprises the steps of:

moving an object in a working plane relative to a laser module;
   emitting laser light by means of a laser module comprising at least two laser arrays of semiconductor lasers and at least one optical element; and
   imaging the laser light emitted by the laser arrays by means of the optical element, such that laser light of semiconductor lasers of one laser array is imaged to one pixel in a working plane and an area element of the pixel is illuminated by means of at least two semiconductor lasers, wherein the optical element is arranged in a way that an object plane of the optical element with respect to the working plane does not coincide with a plane of the semiconductor lasers such that the cones of laser light emitted by adjacent semiconductor lasers overlap in the object plane.

The method may enable a more homogeneous intensity distribution in the working plane.

The method may comprise a further step of moving the laser module(s) perpendicular to a reference plane being parallel to the working plane. The movement perpendicular to the reference plane enables different working planes which are parallel to each other.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of a first laser printing system.

FIG. 2 shows a section of the first laser printing system.

FIG. 3 shows a principal sketch of a section of a second laser printing system.

FIG. 4 shows a principal sketch of an arrangement of laser arrays in a laser module of the laser printing system.

FIG. 5 shows a principal sketch of a first arrangement of laser modules of the laser printing system.

FIG. 6 shows a principal sketch of a second arrangement of laser modules of the laser printing system.

FIG. 7 shows an integrated intensity profile with every second pixel off in the arrangement of laser modules shown in FIG. 6.

FIG. 8 shows an integrated intensity profile with an arbitrary pattern of on/off switched pixels in the arrangement of laser modules shown in FIG. 6.

FIG. 9 shows a principal sketch of method steps of a method of laser printing.

FIG. 10 shows a principal sketch of a third arrangement of laser modules of the laser printing system.

FIG. 11 shows a principal sketch of the first arrangement of laser modules and the respectively associated printing areas in the working plane.

Figure 12:
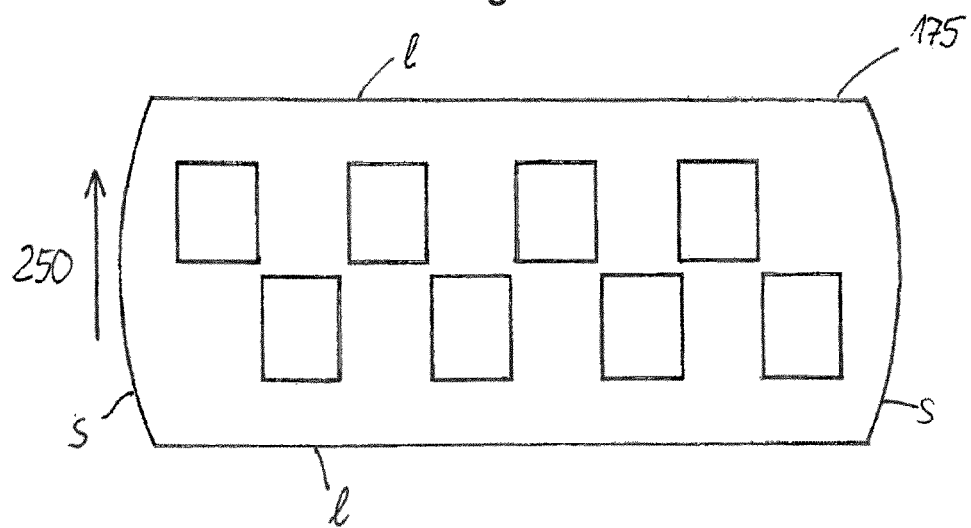

FIG. 12 shows a principal sketch of an embodiment of an optical element associated with a laser module.

Figure 13:
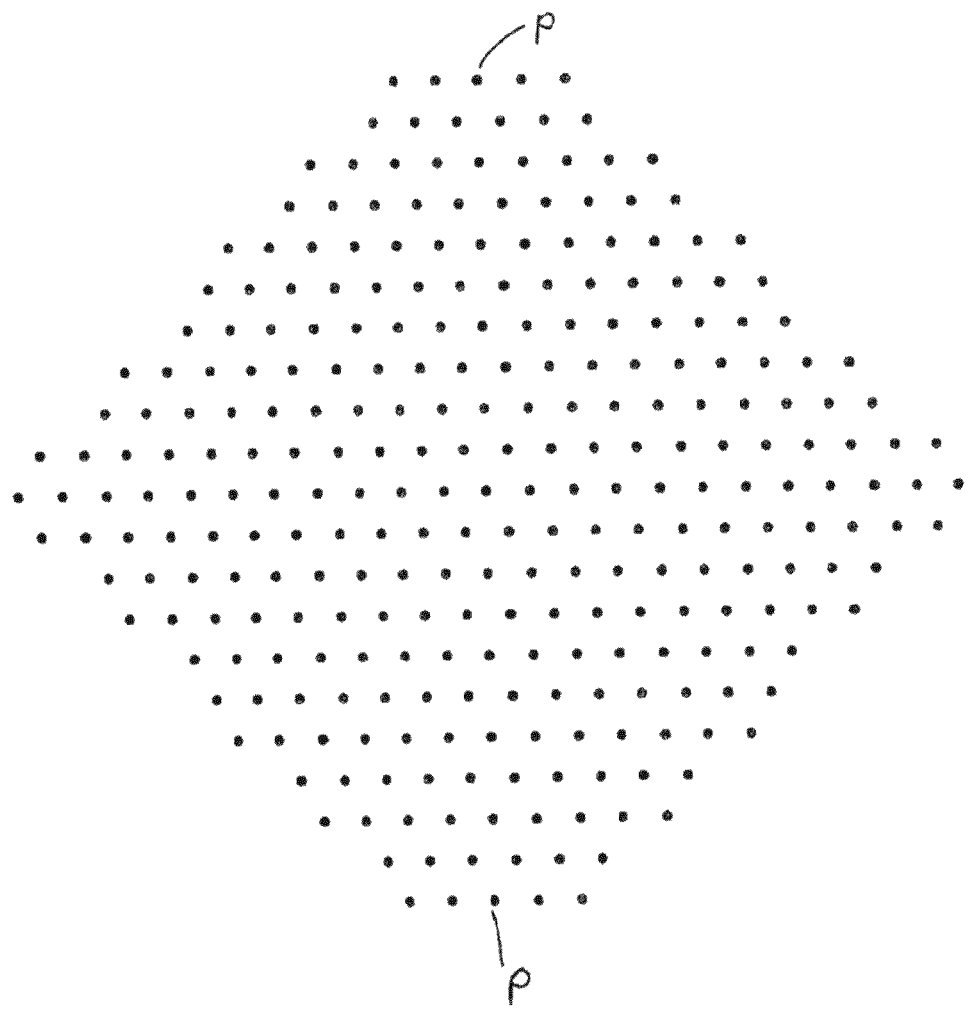

FIG. 13 shows a principal sketch of an alternative arrangement of laser light sources in an array of laser light sources.

Figure 14:
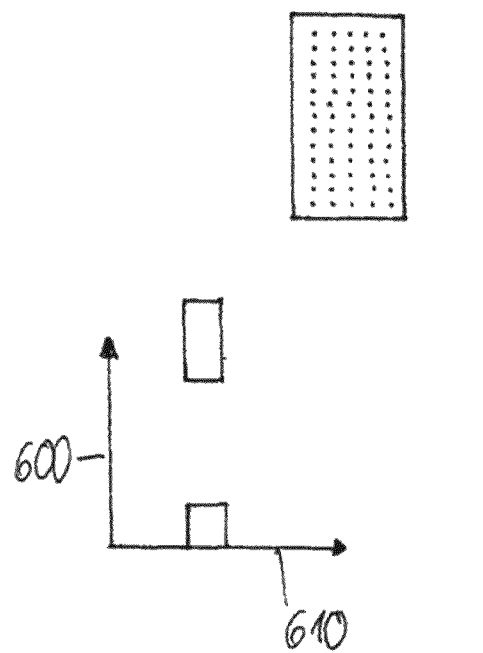

FIG. 14 shows a principal sketch of an arrangement of laser light sources in an array and an associated integrated intensity profile of the array.

Figure 4:
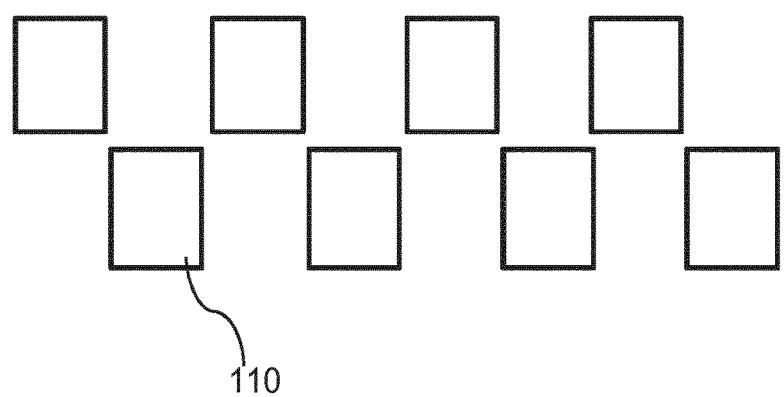
Figure 15:
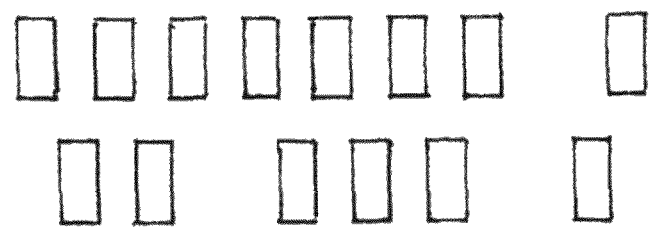
Figure 15:
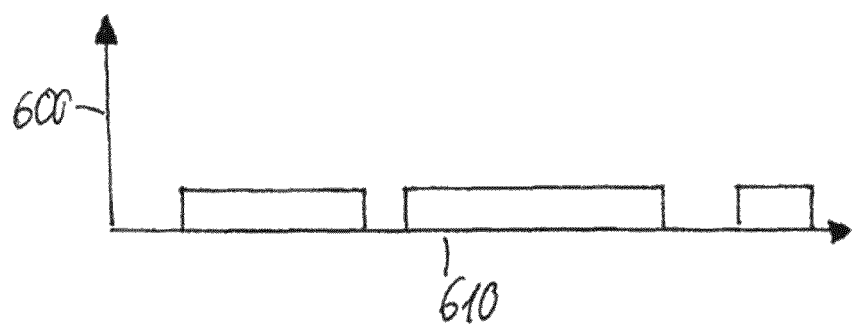

FIG. 15 shows an arrangement of laser arrays according FIG. 14 in a laser module as depicted in FIG. 4 with a pattern of on/off switched pixels and an associated integrated intensity profile.

Figure 16:
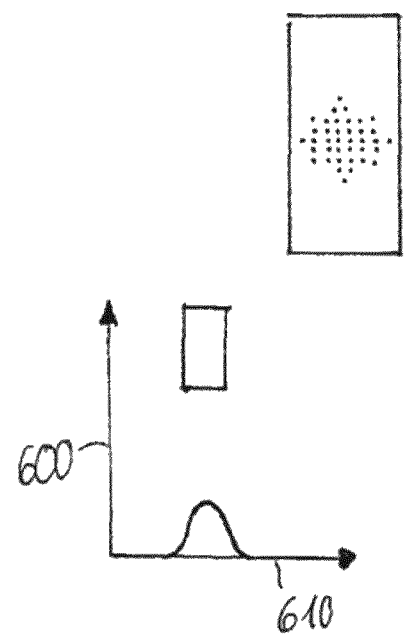

FIG. 16 shows a principal sketch of an arrangement of the laser light sources in an array similar to FIG. 13 and an associated integrated intensity profile of the array.

Figure 17:
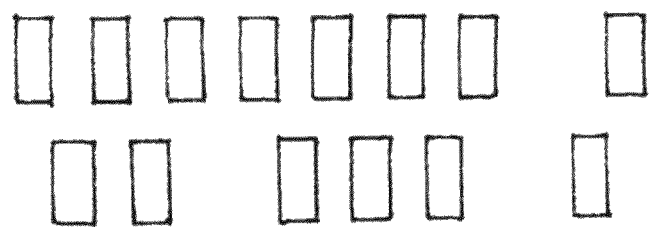
Figure 17:
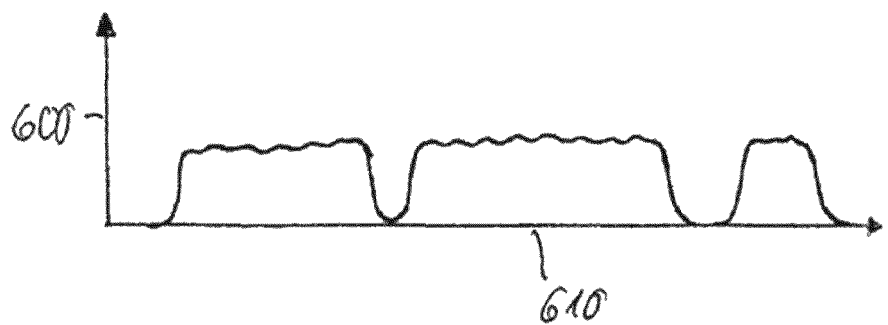

FIG. 17 shows an arrangement of laser arrays according to FIG. 16 in a laser module as depicted in FIG. 4 with a pattern of on/off switched pixels and an associated integrated intensity profile.

In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
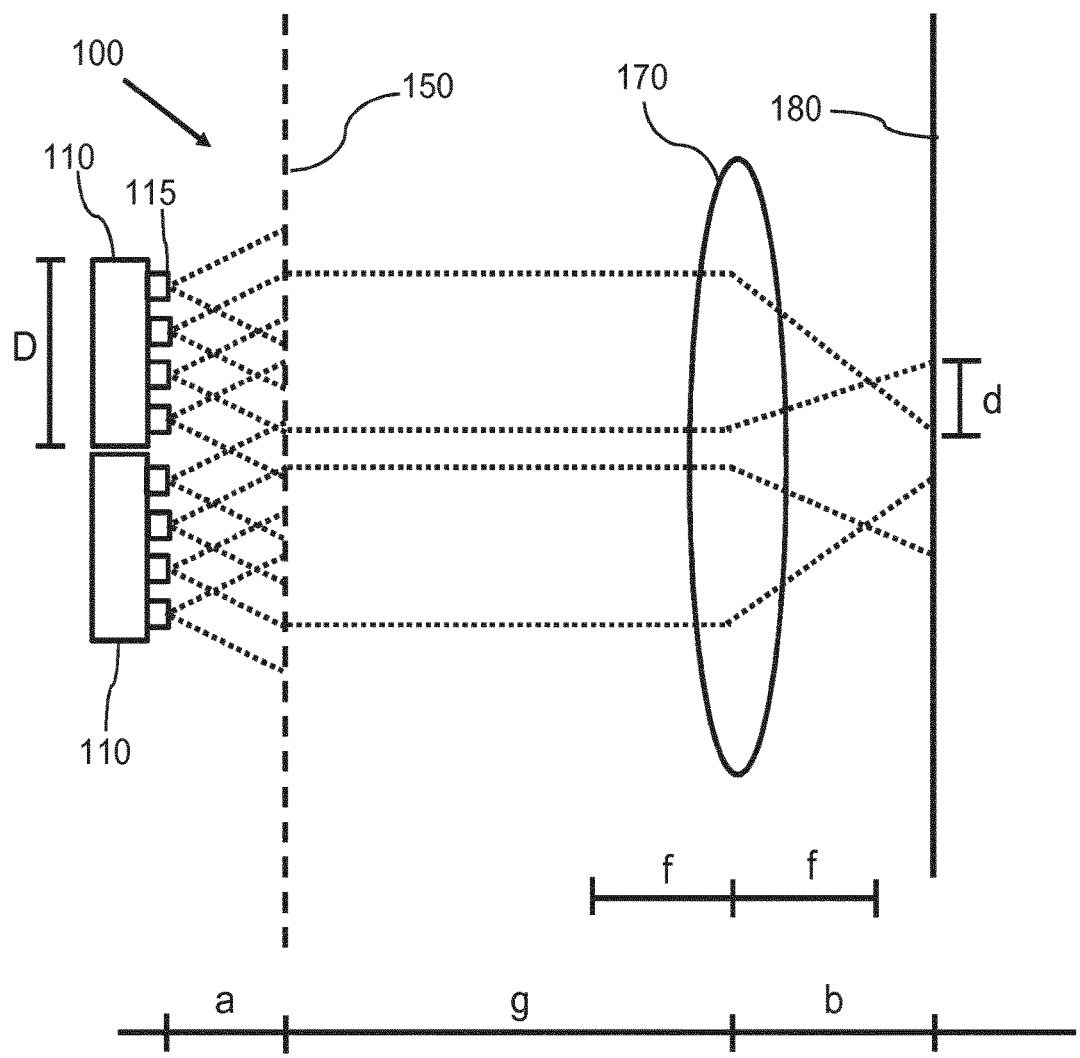
Figure 2:
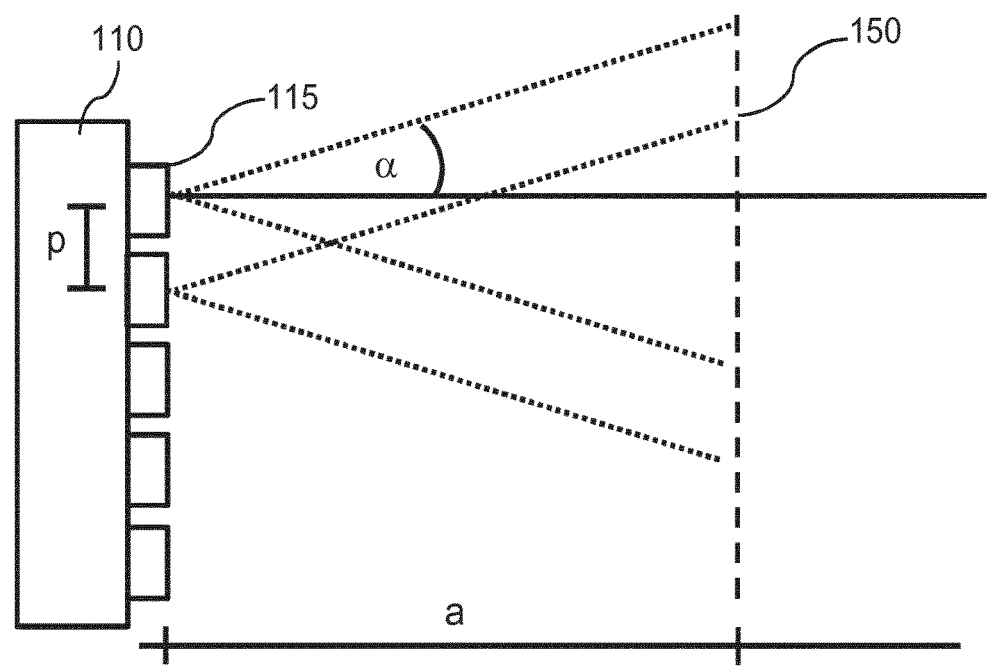

FIG. 1 shows a principal sketch of a first laser printing system 100. The laser printing system 100 comprises two laser arrays 110 with semiconductor lasers 115 and an optical element 170. The semiconductor lasers 115 are VCSELs which are provided on a semiconductor chip. In this case all VCSELs 115 of one array 110 are provided on one chip. The optical element 170 is an imaging lens with a focal distance f. The arrays 110 have a width D perpendicular to the plane of the drawings which is diffusely imaged to a working plane 180 by means of the imaging lens. The width d of the diffuse image of each array 110 with the width D in the working plane 180 defines the width of a pixel in the working plane 180. The width of the pixels d is smaller than the width D of the respective array. The images of the arrays are thus demagnified. The distance b between the working plane 180 and the imaging lens or optical element 170 is bigger than the focal length f of the imaging lens. The optical element 170 or imaging lens defines together with the working plane 180 an object plane 150 in distance g bigger than the focal length of the imaging lens. The light emitting surfaces of the VCSELs 115 are not arranged in the object plane but behind the object plane in a distance such that no sharp projection of the light emitting surfaces of the VCSEL 115 is provided. The distance a between the light emitting layers of the VCSELs 115 and the object plane is chosen in a way that the laser light of at least two VCSEL 115 of one laser array 110 simultaneously illuminate an area element of a pixel. FIG. 2 shows the arrangement of a divergence angle of laser light emitted by one VCSEL 115 in relation to the object plane 150 in more detail. The divergence angle of the VCSELs 115 is given by an angle α as shown in FIG. 2 and defines the cone of laser light emitted by the single VCSEL 115. The VCSELs 115 in the laser array 110 do have a distance p with respect to each other (pitch). The relation between pitch p and distance a has to fulfill the condition:

$$a \cdot p^* (\tan \alpha)^{-1}$$

Laser light emitted by the VCSELs 115 of the laser array 110 overlap in the object plane 150 such that each area of the same size as the laser array 110 in the object plane 150 is illuminated by means of at least two VCSEL 115. Each area element of the pixel defined by the pixel size d is consequently also illuminated via the imaging lens by means of at least two VCSELs 115 of the respective laser array 110. The VCSELs of each laser array are driven in parallel and thus emit laser light at the same time. The size of the pixel is given by $$d=M*D,$$

wherein the magnification M is given by $$M=b/g.$$

The image of the laser array 110 in the working plane 180 is diffuse in order to increase the homogeneity of the energy input to the object in the working plane 180 and improve the reliability with respect to malfunctions of single VCSEL.

Figure 3:
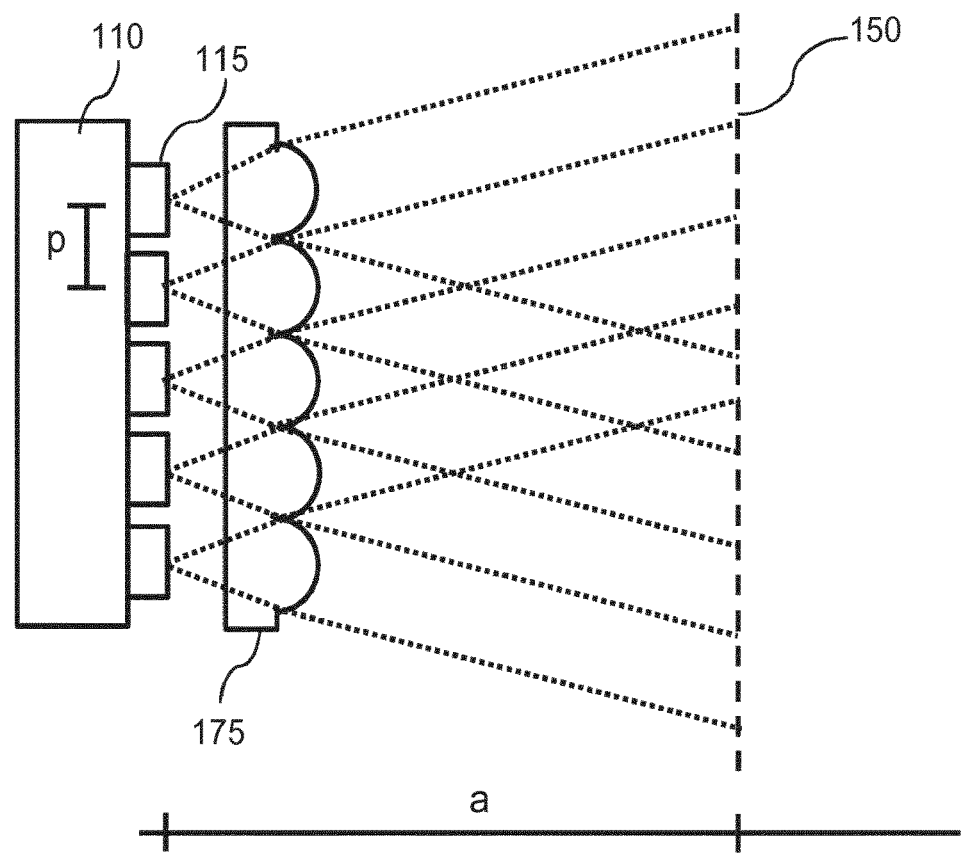

The total distance between the laser arrays 110 of the laser module and the working plane 180 may be increased by means of a micro-lens array 175 which may be combined with the laser array 110 as shown in FIG. 3. The micro-lens array 175 may be arranged between the laser array 110 and the object plane 150 in order to decrease the divergence angle α of each VCSEL 115. The distance a and therefore the total distance to the working plane 150 has to be increased in order to fulfill the condition a·p*(tan α)$^{-1}$ if the pitch of the VCSELs 115 remains the same.

In an improvement of the condition discussed with respect to FIG. 2 may be achieved by taking into account an active diameter v of the VCSELs 115 in case of VCSELs 115 with circular aperture. The active diameter v corresponds to the diameter of the light emitting area of the active layer. The relation between active diameter v, pitch p and distance a has in this improved embodiment to fulfill the condition:

$$a \cdot (p-v)*(2 \tan \alpha)^{-1}.$$

FIG. 4 shows a principal sketch of an arrangement of laser arrays 110 in a laser module of the laser printing system 100. The laser or VCSEL arrays 110 are not quadratic but rectangular, with the long side of the rectangle being arranged in the direction of the movement of the object (see FIG. 5). This allows higher total powers per pixel, without reducing the resolution in the lateral direction. The VCSEL arrays 110 are further arranged in two columns which are slightly shifted with respect to each other (cascaded or staggered arrangement). This enables a defined overlap with respect to the illumination of area elements of the object if the object moves perpendicular to the direction of the columns of VCSELs.

Figure 5:
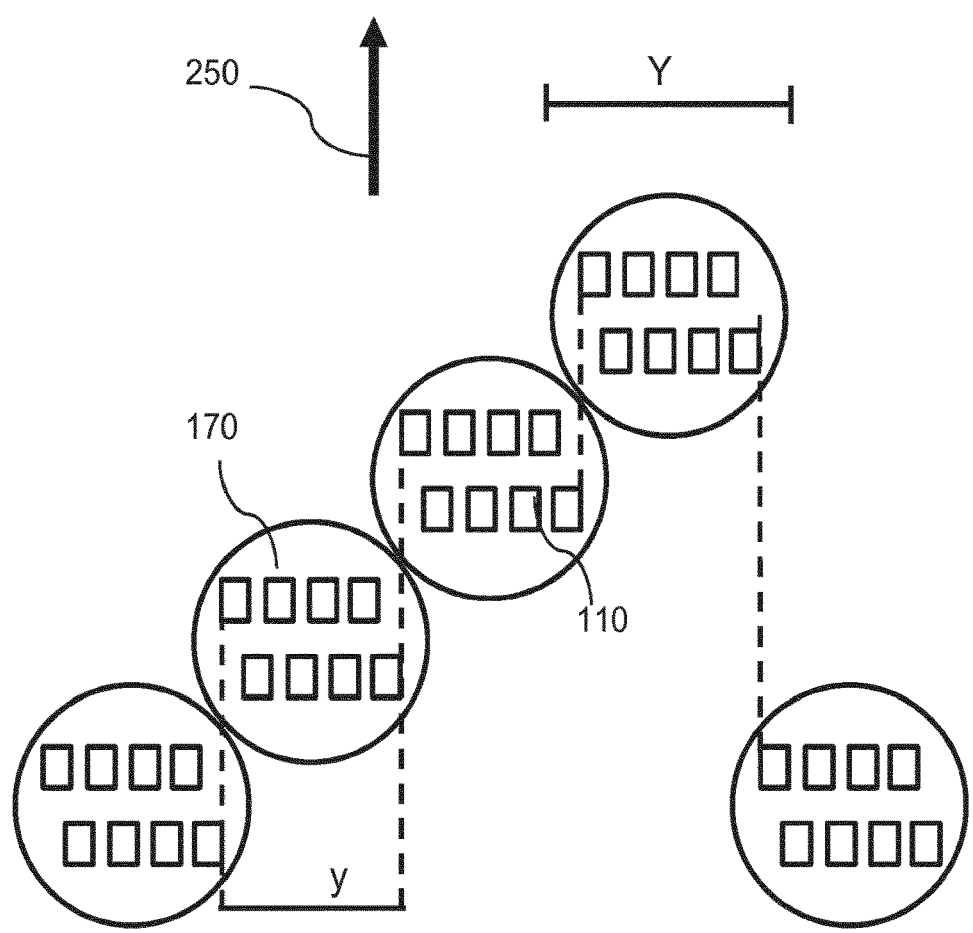

FIG. 5 shows a principal sketch of a first arrangement of laser modules of the laser printing system 100. The laser modules comprise staggered or cascaded arrangements of laser arrays 110 as shown in FIG. 4 and an optical element 170. The optical element 170 images all laser arrays 110 of the respective laser modules to the working plane 180 of the laser printing system 100. The optical element 170 defines the total size Y of the laser module wherein the width of the arrangement of laser arrays 110 of the respective laser module defines the printing width y of one laser module. The laser modules are arranged in columns parallel to each other wherein each column is shifted such that a continuous area can be illuminated in the working plane 180 if the object moves in direction 250 relative to the laser modules. The printing area can thus be adapted to the size of the object in the working plane independent on the size Y and printing width y of the single laser module. The number of columns needed in order to continuously illuminate an object moving in the working plane 180 depends on the size Y and printing width y of the laser modules. The laser modules within one column are separated by at least by a distance Y such that at least N=Y/y columns are needed. The cascaded optical elements 170 may be fabricated as a single piece e.g. by glass molding. Alternatively, a lens array may be assembled from individual lenses by active or passive alignment.

Figure 6:
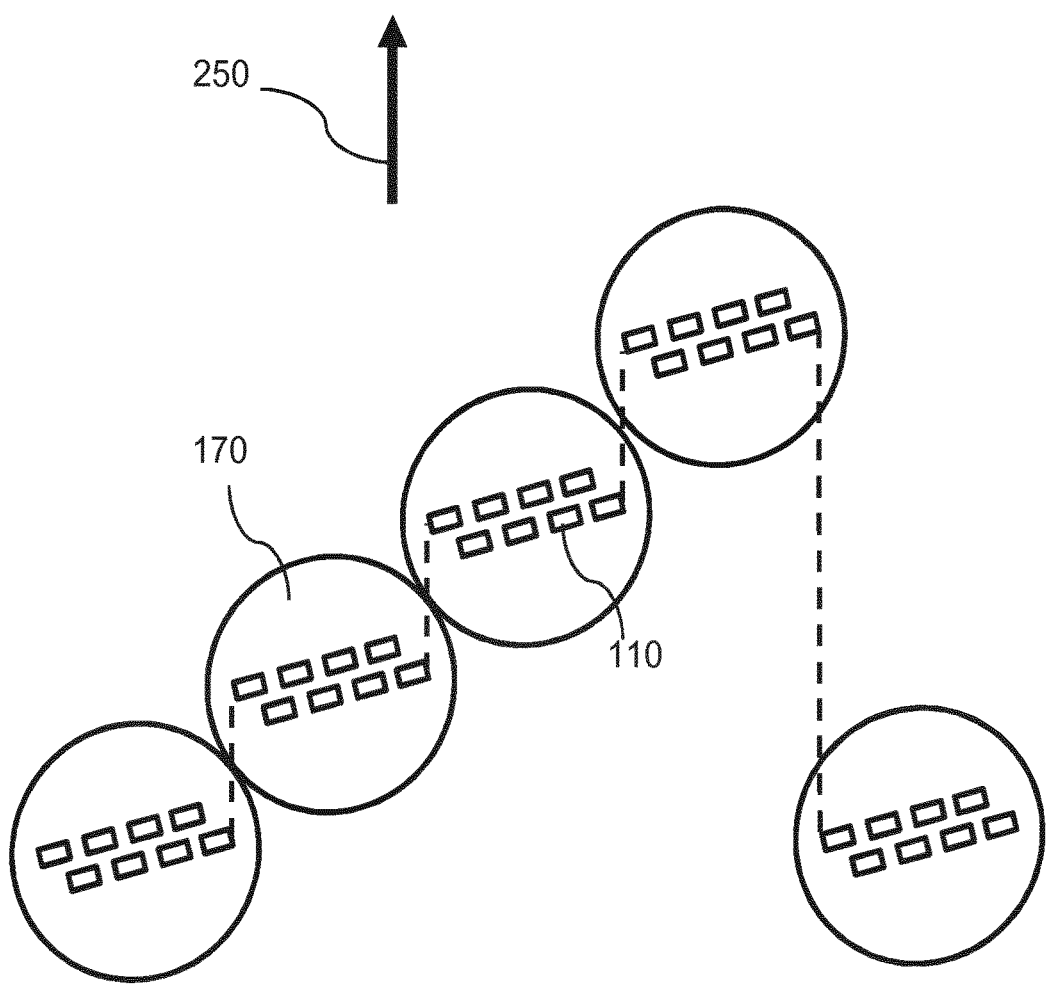

FIG. 6 shows a principal sketch of a second arrangement of laser modules of the laser printing system. The arrangement is quite similar to the arrangement discussed with respect to FIG. 5. The laser arrays 110 of the laser modules are slanted (rotated around their center) with respect to a direction perpendicular to the direction of movement 250 of the object relative to the laser modules. This enables integrated intensity profiles with smooth slopes as shown in FIGS. 7 and 8, which may also overlap with the adjacent pixels, to improve the homogeneity of the total intensity distribution, especially if the pixels are slightly misaligned with respect to each other.

Figure 7:
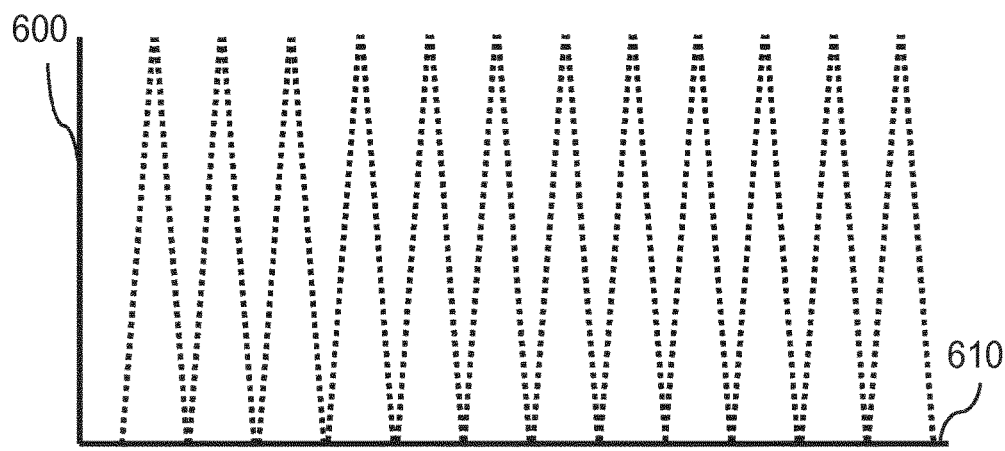
Figure 8:
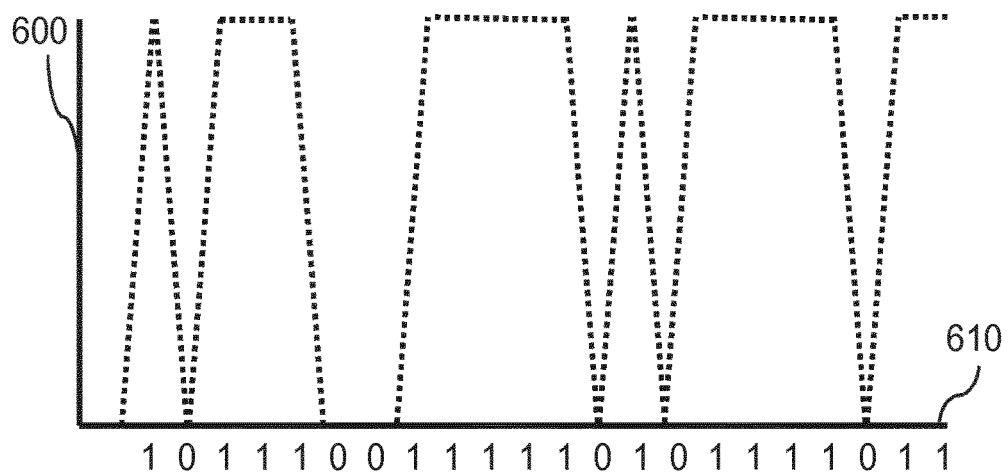

FIG. 7 shows an integrated intensity profile in a direction 610 perpendicular to the direction of movement 250 of the object relative to the laser modules with every second pixel off in the arrangement of laser modules shown in FIG. 6. The pixel profile is almost triangular, with large slopes that overlap with the adjacent pixels. FIG. 8 shows an integrated intensity profile with an arbitrary pattern of on/off switched pixel in the arrangement of laser modules shown in FIG. 6. The numbers "1" and "0" indicate which of the adjacent laser arrays 110 are switched on or off. The integrated intensity profile shows the overlap of two or more neighboring pixels in the working plane 180.

Figure 9:
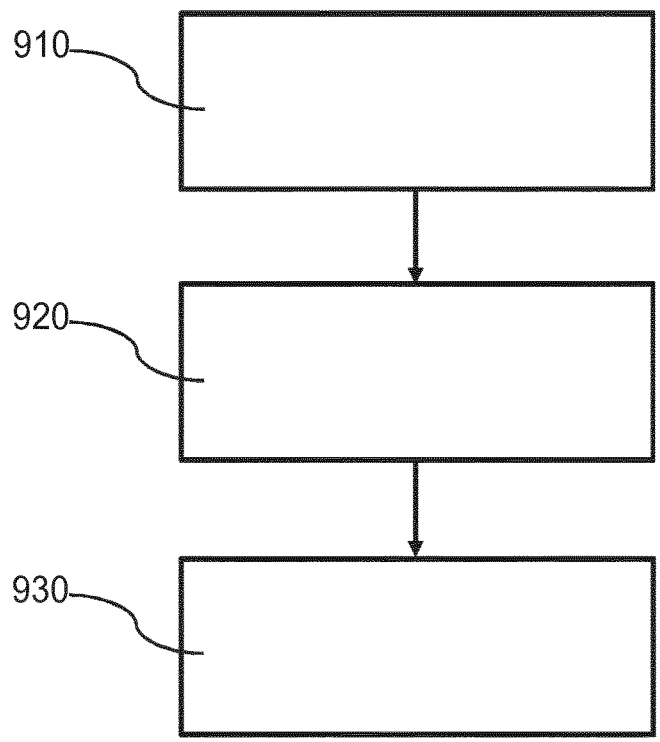

FIG. 9 shows a principal sketch of method steps of a method of laser printing. The shown sequence of steps does not necessarily imply the same sequence during execution of the method. Method steps may be executed in different order or in parallel. In step 910 the object like a sheet of paper is moved in the working plane of the laser printing system relative to the laser module. In step 920 laser light is emitted by means of the laser module comprising at least two laser arrays of semiconductor lasers and at least one optical element. In step 930 the laser light emitted by the laser arrays is imaged, such that laser light of semiconductor lasers of one laser array is imaged to one pixel in the working plane and an area element of the pixel is illuminated by means of at least two semiconductor lasers. The object may be moved and at the same time laser light of the laser arrays may be emitted and imaged to the working plane.

When using individually addressable lasers or laser arrays, the maximum speed in the printing especially 3D printing process can be obtained when along a line all individual pixels can be written at the same time, i.e. by a separate laser or laser array per pixel. Typical line widths in a laser printing system or machine are in the order of 30 cm or more. On the other hand, the size or printing width of a laser module of individually addressable lasers or laser arrays is limited to a few cm. These laser modules correspond usually to one micro-channel cooler on which the laser modules are arranged.

It is therefore necessary to use a number of laser modules and corresponding micro-channel coolers and to stack them together to a complete laser printing module or printing head. Alignment tolerances between neighboring micro-channel coolers with laser modules may result in a gap in the working plane 180 to which no or not sufficient laser light can be provided. In worst case such a gap leads to defects with respect to processing of the object as printed sheets of minor quality or in the parts produced by means of a 3D printer/rapid prototyping machine.

In view of the typical size of a laser light source 116 of 100 μm and the fact that several alignment tolerances add up together, the problem of a gap is a severe issue. Even with tight tolerances in each individual step of assembling the laser printing system, the overall tolerance chain can lead to significant deviations of 30 μm or more.

It may be advantageous in this respect not only to provide overlapping intensity distributions but to use additional laser light sources 116 at the edge of each laser module. Said laser light sources 116 are so called overlap laser light sources 117 which are arranged such that the light of these overlap laser light sources 117 overlaps with light of laser light sources 116 of neighboring laser module. This means that the pitch between neighboring laser modules is by at least the width of one laser light source 116 (e.g. 100 μm) smaller than the total printing width of the laser module.

If the maximum tolerance from the mechanical/optical alignment of neighboring laser modules is smaller than the width of one laser light source 116, it is sufficient to have—by design—an overlap of one laser light source 116 in order to avoid gaps in the working plane to which no laser light can be provided. Anyhow, it may alternatively be possible to provide more than one overlap laser light sources 117 if the maximum tolerance from the mechanical/optical alignment of neighboring laser modules is bigger than the width of one laser light source 116. It may in this case be possible to use the overlap laser light sources 117 in accordance with the width of the gap between neighboring laser modules. The laser printing system may in this case be calibrated such that the overlap laser light sources 117 fill the unintended gap between the laser modules. Depending on the gaps and the width of one laser light source 116 it may be that one, two, three or even more of the overlap laser light sources 117 are used in order to enable a seamless illumination of the working plane.

Figure 10:
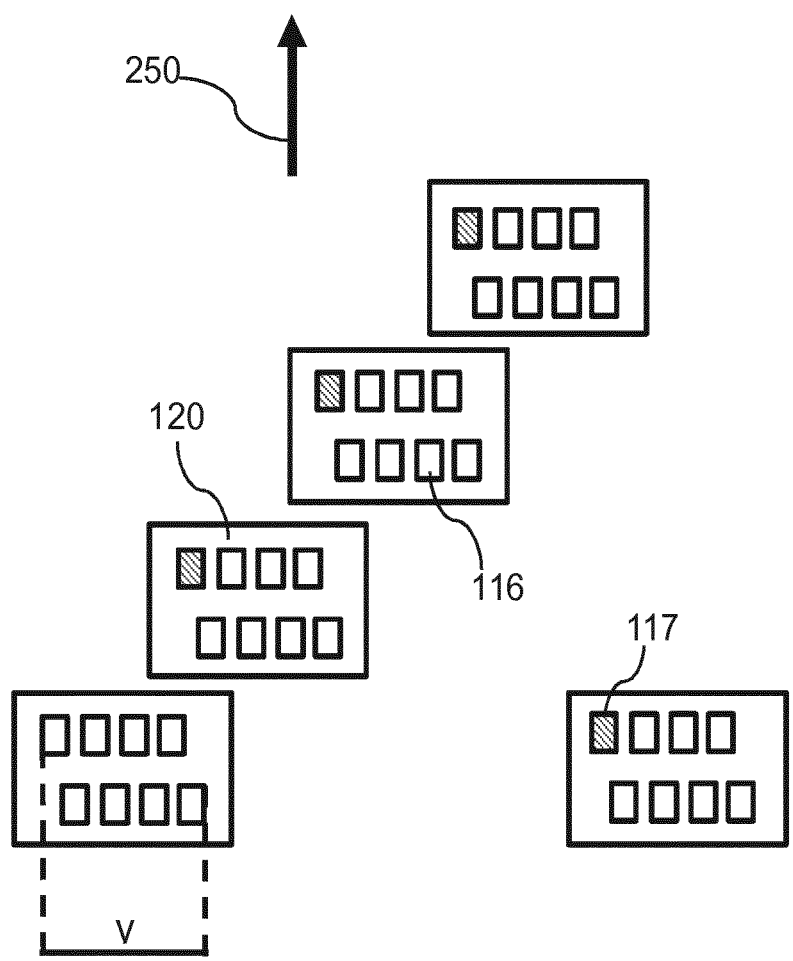

FIG. 10 shows an embodiment of such an arrangement with overlap laser light sources 117 which are laser light source 116 which are arranged in an overlapping arrangement of neighboring laser modules which are laser sub-modules 120 in order to compensate potential misalignment of laser sub-modules 120 with respect to each other. The overlap laser light sources 117 are indicated by a line pattern.

The printing width of neighboring laser sub-modules 120 overlap by a complete laser light source 116 or more explicit overlap laser light source 117. A laser light source 116 may comprise different as the previous embodiments only a single laser or in accordance with the previous embodiments a laser array such as laser arrays 110. The single lasers may comprise optical elements like micro-lenses. In case of laser arrays micro-lens arrays may be comprised. The arrangement of the laser sub-modules 120 is similar to the arrangement as shown in FIG. 5. The laser modules shown in FIG. 5 are arranged such that each laser array 110 illuminates a dedicated pixel or area element in the working plane 180. The laser sub-modules 120 as shown in FIG. 10 are arranged such that in case of no alignment errors during assembly the overlap laser light sources 117 are adapted such that they can illuminate the same area element in the working plane 180 as a laser light source 116 of a neighboring laser sub-module 120.

Figure 11:
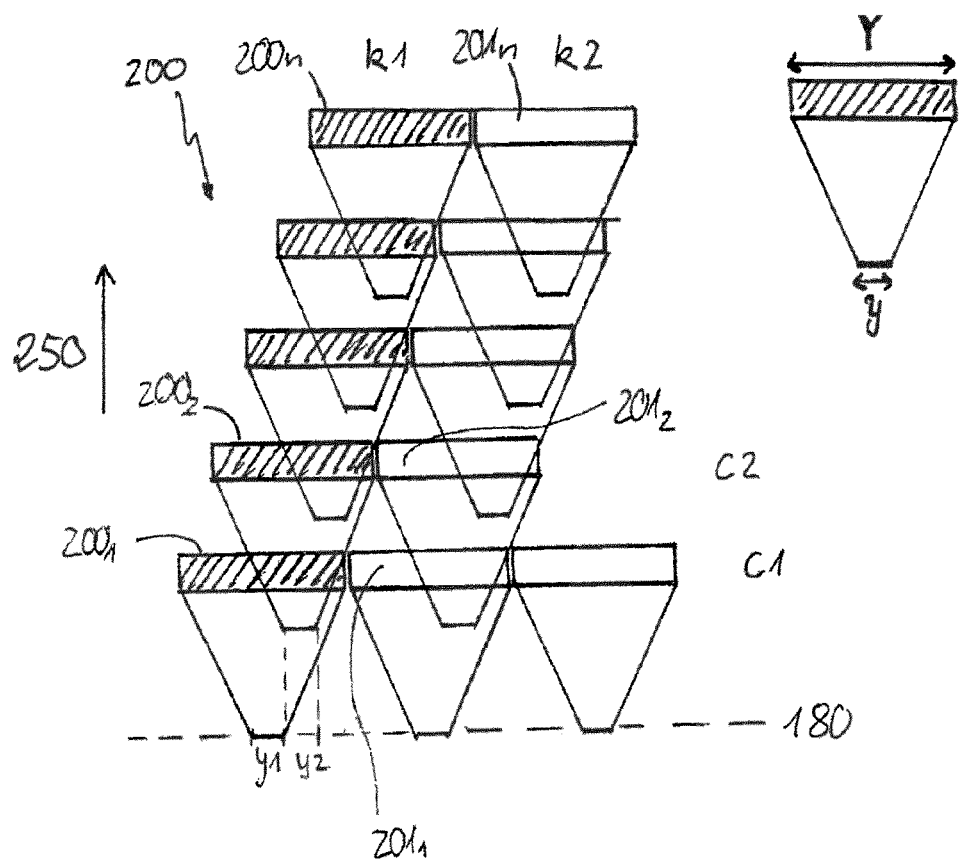

FIG. 11 shows an arrangement of laser modules similar to that of FIG. 5 with the difference that more than two columns and the demagnified image produced by the laser modules with the optical elements in the working plane 180 are shown. As schematically depicted in FIG. 11, the arrangement modules includes a plurality of laser modules 200 arranged in columns perpendicular to the direction of movement 250. Like in FIGS. 5 and 6, the columns of the laser modules are staggered with respect to each other such that a first laser module $200_1$ of a first column c1 of laser modules is adapted to illuminate a first area y1 in the working plane 180. The second module $200_2$ of a second column c2 of laser module adapted to illuminate a second area y2 in the working plane 180, wherein the first area y1 is adjacent to the second area y2 such that continuous illumination of the object is enabled. By means of this, the illuminated areas y1, y2 in the working plane 180 form a contiguous area in the direction perpendicular to the direction of movement. As further depicted in FIG. 11, laser modules that are staggered in the direction of movement 250 form cascades. A first cascade k1 is formed by the fit modules $200_1$, $200_2$, $200_n$ of the columns. A second cascade k2 is formed by the second laser modules $201_1$, $201_2$, $201_n$ of the columns and so on. The number of cascades is such that the sum of the individual printing widths y in a direction perpendicular to the direction of movement 250 covers the whole area to be illuminated in the working plane.

Preferably, the laser arrays 110 of the modules 200 are arranged as depicted FIG. 4. In a further preferred embodiment, an optical element 175 associated with such an arrangement of the laser arrays 110 has a contour obtained from a circular or rotationally symmetrical contour, which is truncated onto opposing sides and wherein the opposing sides 1 of the optical element 175 are aligned with respect to each other along an axis which is preferably orientated in a direction perpendicular to the direction of movement 250. More precisely, in the case of the arrangement of the laser arrays as in FIG. 4, the optical element 175 has the contour of a modified rectangle with two opposing circular segment-shaped short sides s that connect the parallel long sides 1. This takes into account that a circular optical element would not be fully illuminated with the rectangular arrangement of the laser arrays as depicted in FIG. 4. Hence, the portions of a circular optical element that are not fully illuminated can be omitted. By means of the shape of the optical element 175, the size of a module in the direction of movement 250 can be reduced. As a result thereof, the size of the arrangement of laser modules in the direction of movement 250 can be reduced. This has the advantage that a line oriented in the direction of movement can be illuminated within a reduced time enhancing the productivity of the whole 3D-printing system. Also, neighboring pixels at the border between one module $200_1$ and a neighboring module $200_2$ of one cascade k1 and/or of one module $200_n$ of one cascade k1 and a neighboring module $201_1$ of a neighboring cascade k2 can be illuminated with reduced time offset. This also increases the quality of the three-dimensional article.

The arrangement of the VCSEL in laser array 110 defines the intensity profile. If the arrangement is substantially rectangular, i.e. the VCSELs are arranged in the array in rows and columns, the integrated intensity profile 600 of the array is substantially rectangular, i.e. the integrated intensity profile has a so-called "flat top" profile as depicted in FIG. 14. In a module according to FIG. 4, where several arrays 110 are switched on and several arrays are switched off, the integrated intensity of the module in a direction 610 perpendicular to the direction of movement 250 is as shown in FIG. 15, i.e. has sharp edges.

It may be desirable to have an integrated intensity profile without sharp edges. This can be achieved by an arrangement according to FIG. 13, wherein the VCSELs in one array 110 are positioned in rows and columns and wherein the outer contour of the array is substantially polygonal, in particular, substantially hexagonal. The individual VCSELs are positioned at grid points that are staggered from one column to the next column, wherein the columns are oriented perpendicular to the direction of movement 250. Preferably, the outer contour of the array has a hexagonal shape with two opposing parallel sides p which extend perpendicular to the direction of movement 250.

As depicted in FIG. 16, the integrated intensity profile 600 of a laser array with a substantially hexagonal shape as shown in FIG. 13, has rounded edges and is similar to a Gaussian intensity distribution. For a laser module with switched on/off arrays, the integrated intensity profile 600 along a direction 610 comprises rounded transitions as depicted in FIG. 17. Hence, deviations from an average value of intensity are smaller.

With the an arrangement of laser modules, one pixel in the working area is illuminated by a multitude of semiconductor lasers of a laser array 110 at the same time. The total number of semiconductor lasers may be selected such that failure of less than a predetermined number of the semiconductor lasers reduces the output power of the laser array 110 only within a predetermined tolerance value. As a result thereof, the requirements with respect to the working life of the individual VCSELs may not be unusually high.

The individual VCSELs of a laser array may be grouped in sub-groups with respect to their addressability by control signals. A sub-group may include at least two VCSELs. At least two sub-groups of VCSEL of one laser array may be individually addressable such that an output power of the laser array 110 is controllable by switching off one or more, sub-groups of VCSEL. Also, an embodiment may be provided where the semiconductor lasers of one laser array are individually addressable so that an output power of the laser array may be controlled by switching on/off individual semiconductor lasers.

In a further embodiment, the semiconductor lasers or the laser arrays of the arrangement of laser modules can be further controlled such that a semiconductor laser or a laser array which is not used for illuminating can optionally be used for providing heat to the material in the working plane 180. To accomplish this, a control device is provided which controls the semiconductor lasers or the laser arrays individually. This heating can be used in addition to the separate heating device described above or as an exclusive heating system that pre-heats the object to a working temperature.

The arrangement of laser modules may include overlap light sources 117 as explained with reference to FIG. 10. The overlap light sources 117 are preferably provided at the border between one module of one column to a neighboring module of a neighboring column, for example module $200_1$ of column c1 and module $200_2$ of column c2 in FIG. 13 and/or from one module in one cascade to a neighboring module in a neighboring cascade, for example module $200_n$. In cascade k1 and module $201_1$ in cascade k2 in FIG. 11. The overlap light source 117 balances the energy loss resulting from a time offset of adjacent pixels perpendicular to the direction of movement 250 due to the staggered arrangement of a module and/or due to the cascaded arrangement of the modules.

The overlap light sources 117 can be controlled in such a manner that energy losses due to time offset and/or energy losses or energy excesses due to misalignment of VCSELs or arrays can be compensated. Hence, the sum of energy that is provided to the working area by overlap light sources 117 can be adjusted to be the energy necessary for illuminating in the case of time offset zero and/or perfectly aligned VCSELs or arrays. The energy provided by the overlapping VCSELs or arrays can be selected depending on the type of building material. Influencing factors may be the heat conductivity of the object.

In a further modification, the semiconductor lasers of the illumination unit are realized by VECSEL (Vertical External Cavity Surface Emitting Laser).

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 100 laser printing system
110 laser array
115 semiconductor laser
116 laser light source
117 overlap laser light source
120 laser sub-module
150 object plane
170 optical element
175 micro-lens array
180 working plane
200, $200_1$, $200_2$, $200_n$
$201_1$, $201_2$, $201_n$ laser modules
250 direction of movement
600 integrated intensity
610 direction perpendicular to direction of movement
750 protective device
800 control unit
910 method step of the object
920 method step of emitting laser light
930 method step of imaging the laser light

The invention claimed is:

1. A laser module in a laser printing system for illuminating an object moving relative to the laser module in a working plane, the laser module comprising:
at least two laser arrays comprising semiconductor lasers; and
at least one optical element,
wherein the at least one optical element is configured to image laser light emitted by the semiconductor lasers so that laser light of one laser array is imaged onto a pixel in the working plane and so that an area element of the pixel is illuminated by at least two semiconductor lasers,
wherein the optical element is configured so that an object plane of the optical element with respect to the working plane does not coincide with a light-emitting plane in which the light emitting-surfaces of the semiconductor lasers are disposed such that cones of laser light emitted by adjacent semiconductor lasers overlap in the object plane.

2. The laser module according to claim 1, further comprising a plurality of the laser arrays.

3. The laser module according to claim 1, wherein the optical element comprises one lens configured to image the laser light of the laser arrays to the working plane.

4. The laser module according to claim 1, wherein the optical element is configured such that images of the laser arrays overlap in the working plane.

5. The laser module according to claim 1, wherein the laser arrays are arranged in columns perpendicular to a direction of movement of the object in the working plane, the columns are staggered with respect to each other such that a first laser array of a first column is configured to illuminate a first area of the object and a second laser array of a second column is configured to illuminate a second area of the object, wherein the first area is adjacent to the second area such that continuous illumination of the object is enabled.

6. The laser module according to claim 1, wherein the laser arrays are rectangular with a long side of a rectangle being arranged parallel to a direction of movement of the object in the working plane.

7. The laser module according to claim 1, wherein the optical element is configured to demagnify the image of the laser arrays in the working plane.

8. The laser module according to claim 1, wherein each laser array comprises a micro-lens array, the micro-lens array being arranged to lower divergence of the laser light emitted by the semiconductor lasers.

9. The laser module according to claim 1, comprising at least a said first and a said second laser module arranged next to each other, each laser module comprising said at least two laser arrays, wherein at least one of the two laser arrays of the first or the second laser module is arranged as an overlap laser light source such that in operation at least one defined area element in the working plane can be illuminated by the overlap laser light source and a laser array of the laser module arranged next to the laser module comprising the overlap laser light source.

10. A laser printing system for illuminating an object, comprising:
at least two laser modules, each laser module comprising:
at least two laser arrays comprising semiconductor lasers; and
at least one optical element,
wherein the at least one optical element is configured to image laser light emitted by the semiconductor lasers so that laser light of one laser array is imaged onto a pixel in the working plane and so that an area element of the pixel is illuminated by at least two semiconductor lasers, and
wherein the optical element is configured so that an object plane of the optical element with respect to the working plane does not coincide with a light-emitting plane in which the light emitting-surfaces of the semiconductor lasers are disposed such that cones of laser light emitted by adjacent semiconductor lasers overlap in the object plane.

11. The laser printing system according to claim 10, wherein the laser modules are arranged in columns perpendicular to a direction of movement of the object in the working plane, the columns are staggered with respect to each other such that a first laser module of a first column is configured to illuminate a first area of the object, and a second laser module of a second column is configured to illuminate a second area of the object, wherein the first area is adjacent to the second area such that continuous illumination of the object is enabled.

12. The laser printing system according to claim 11, wherein the columns of the laser modules are arranged such that a distance between the laser modules in one column is minimized.

13. The laser printing system according to claim 11, wherein the laser arrays of each laser module are arranged in an elongated arrangement with a long side of the elongated arrangement being arranged perpendicular to a direction of movement of the object in the object plane.

14. The laser printing system according to claim 11, wherein the laser arrays of each laser module are arranged in an elongated arrangement with a long side of the elongated arrangement being arranged slanted to a direction being perpendicular to the direction of movement of the object in the working plane.

* * * * *